(12) United States Patent
Kabade

(10) Patent No.: US 8,791,356 B2
(45) Date of Patent: Jul. 29, 2014

(54) PHOTOVOLTAIC (PV) MODULE WITH IMPROVED BUS TAPE TO FOIL RIBBON CONTACT

(75) Inventor: Rajendra Rambhau Kabade, Littleton, CO (US)

(73) Assignee: First Solar, Inc., Tempe, AZ (US)

(*) Notice: Subject to any disclaimer, the term of this patent is extended or adjusted under 35 U.S.C. 154(b) by 590 days.

(21) Appl. No.: 12/842,352

(22) Filed: Jul. 23, 2010

(65) Prior Publication Data

US 2012/0017965 A1    Jan. 26, 2012

(51) Int. Cl.
*H01L 31/042*    (2014.01)
*H01L 31/05*    (2014.01)

(52) U.S. Cl.
USPC ............ 136/251; 136/244; 136/245; 136/249

(58) Field of Classification Search
USPC .................................................. 136/244–265
See application file for complete search history.

(56) References Cited

U.S. PATENT DOCUMENTS

| | | |
|---|---|---|
| 5,457,057 A | 10/1995 | Nath et al. |
| 5,922,142 A | 7/1999 | Wu et al. |
| 6,137,048 A | 10/2000 | Wu et al. |
| 6,169,246 B1 | 1/2001 | Wu et al. |
| 6,221,495 B1 | 4/2001 | Wu et al. |
| 2010/0043862 A1 | 2/2010 | Croft |
| 2010/0071752 A1* | 3/2010 | Vellore et al. ............ 136/244 |
| 2010/0147357 A1* | 6/2010 | Yagiura ................... 136/244 |

FOREIGN PATENT DOCUMENTS

| | | | |
|---|---|---|---|
| JP | 2002343996 A | * | 11/2002 |
| JP | 2004140100 A | * | 5/2004 |
| WO | WO 2009099180 A1 | * | 8/2009 |

OTHER PUBLICATIONS

JP 2002343996A English machine translation.*
JP 2004140100A English machine translation.*

* cited by examiner

*Primary Examiner* — Jonathan Johnson
*Assistant Examiner* — Andrew Golden
(74) *Attorney, Agent, or Firm* — MacMillan, Sobanski & Todd, LLC

(57) ABSTRACT

A photovoltaic a substrate having a plurality of individual serially connected solar cells defined thereon. A bus tape is applied along respective ones of said cells at generally opposite longitudinal ends of the substrate for collecting the charge generated by the plurality of solar cells. A conductive member is interconnected between the bus tapes and is disposed beneath the bus tapes and in direct conductive contact with the respective cells. A junction box is configured for delivering the generated charge to an external load or other component, with the conductive member connected to the junction box.

18 Claims, 3 Drawing Sheets

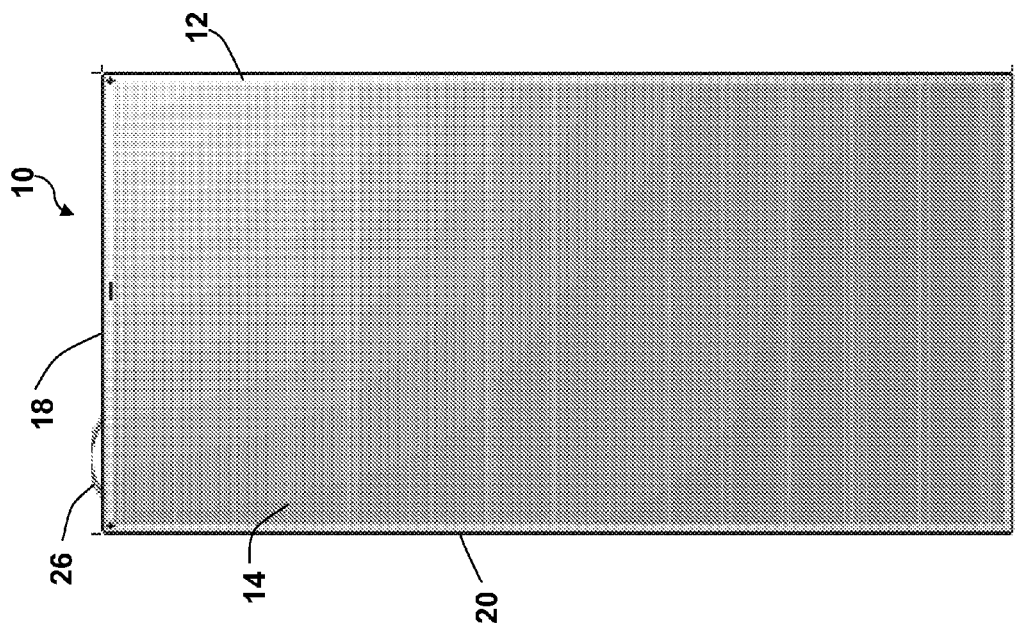
Fig. -1-
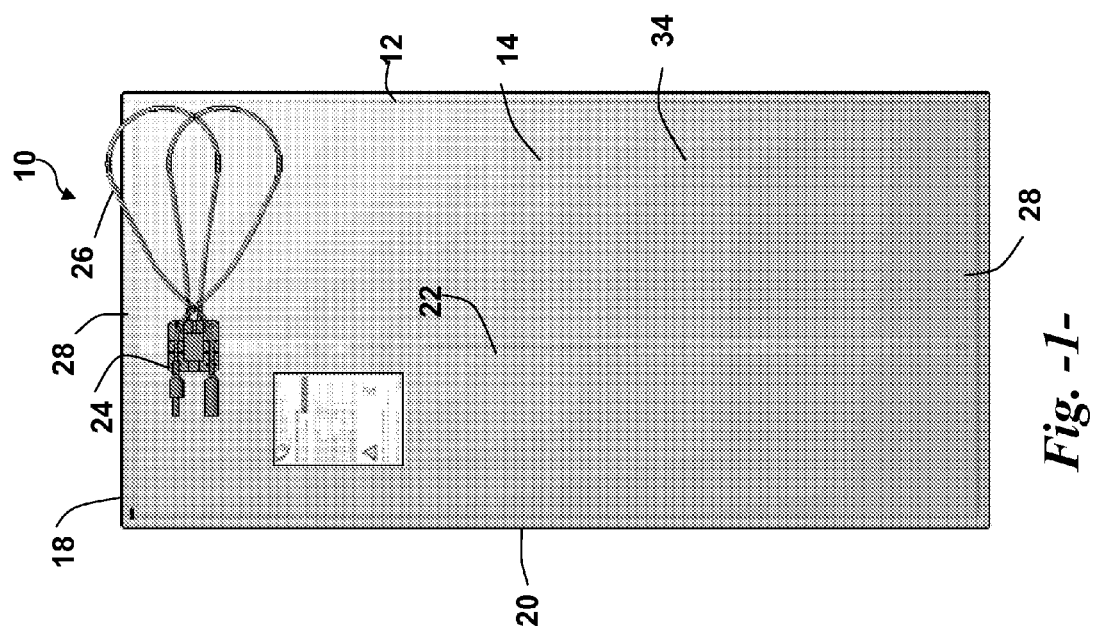
Fig. -2-

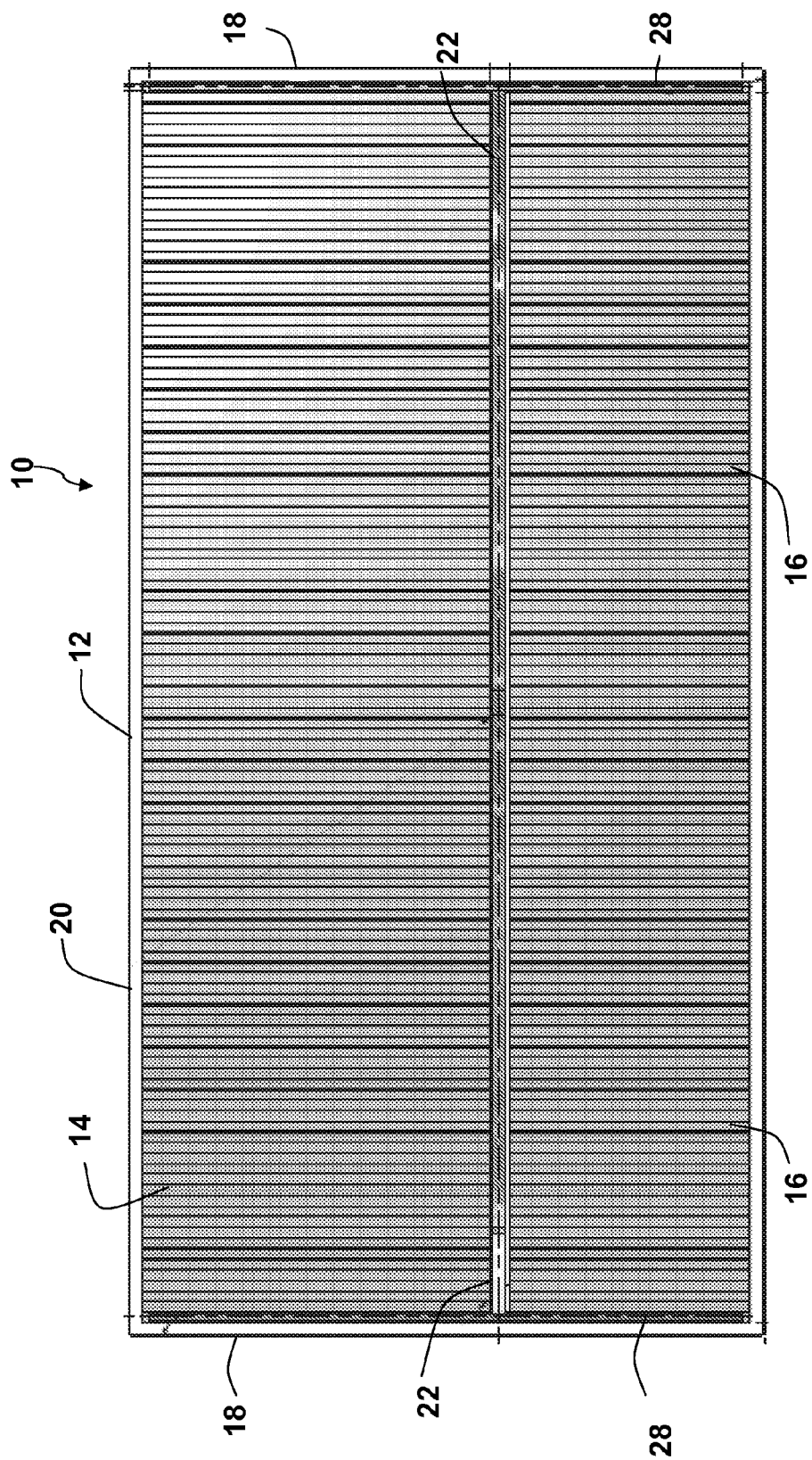
Fig. -3-

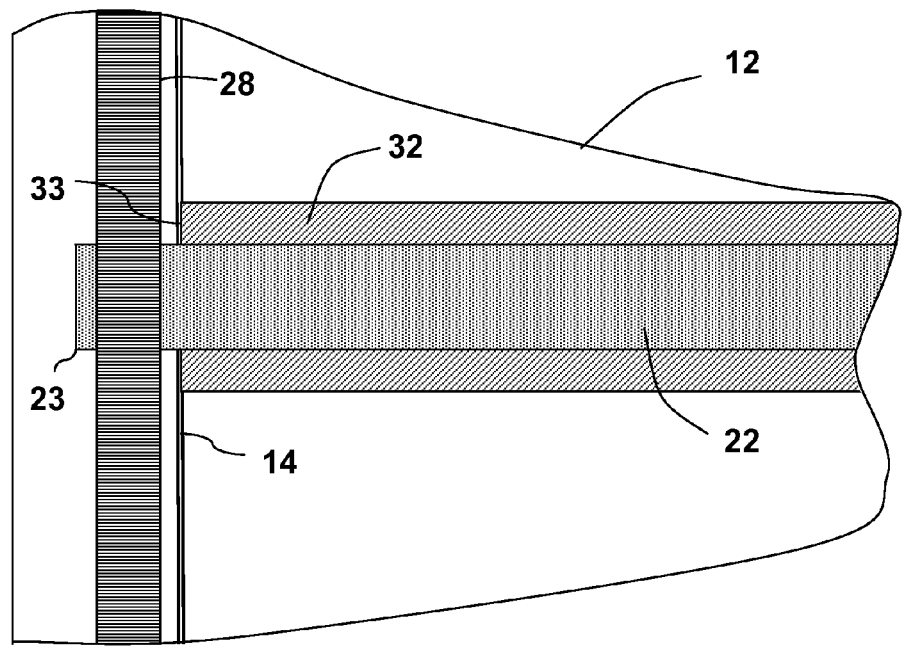
*Fig. -4-*
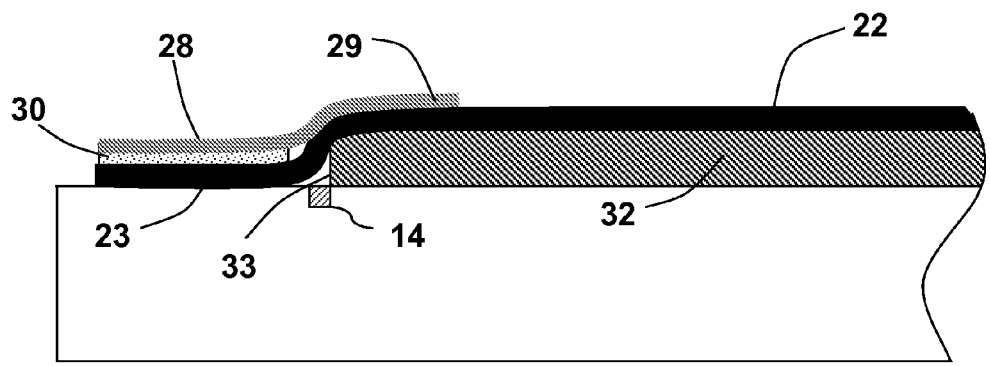
*Fig. -5-*

PHOTOVOLTAIC (PV) MODULE WITH IMPROVED BUS TAPE TO FOIL RIBBON CONTACT

FIELD OF THE INVENTION

The subject matter disclosed herein relates generally to the photovoltaic (PV) modules, and more particularly to an improved contact between the bus tapes and foil ribbon on PV modules.

BACKGROUND OF THE INVENTION

Thin film photovoltaic (PV) modules (also referred to as "solar panels") are gaining wide acceptance and interest in the industry. The PV modules are conventionally formed by deposition of various semiconductor materials and electrode layers as thin (generally recognized in the art as less than 10 microns) film layers on a glass substrate. The substrate then undergoes various processing steps, including laser scribing processes, to define and isolate individual cells, define a perimeter edge zone around the cells, and to connect the cells in series. These steps result in generation of a plurality of individual solar cells defined within the physical edges of the substrate.

A well known method for collecting the charge from a PV module is to attach a strip of insulation (e.g., an insulating tape) lengthwise along the module across the cells. A conductive foil (e.g. a foil tape or ribbon) is then aligned and attached to the insulation tape. Bus bars (typically in the form of an adhesive bus tape) are then attached at opposite longitudinal ends of the module aligned with the first and last cells, respectively. The bus tapes cross over and attach to the foil layer, collect the charge from the cells, and transfer the charge to the foil ribbon. The foil ribbon is separated in a junction box wherein leads are connected to the separated foil ends. The leads provide a means to connect the PV module to a load, other cells, a grid, and so forth.

The electrical junction between the bus tapes and foil ribbon is critical to the PV module. If the junction fails at either location, an open circuit is created and the PV module becomes useless. Unfortunately, this junction has proven to be problematic. The bus tapes are typically embossed and include a non-conductive adhesive applied to the tape. Electrical contact between the bus tapes and foil ribbon is thus dependent on sufficient ridge depth created by the embossment process. The adhesive is intended to secure the tape to the foil ribbon, but the ridges must penetrate through the adhesive to make electrical contact with the foil ribbon. If the ridge depth is insufficient or the ridges become crushed in the application process, electrical contact is not made or is unreliable. In addition, failure of the adhesive results in the tape pulling away from the foil ribbon, again resulting in loss of electrical contact. This is a particular concern with repeated temperature cycling of the module.

Accordingly, there exists an ongoing need in the industry for an improved, robust, and more reliable electrical contact between the bus tapes and foil ribbon that will reduce the occurrence of failed PV modules.

BRIEF DESCRIPTION OF THE INVENTION

Aspects and advantages of the invention will be set forth in part in the following description, or may be obvious from the description, or may be learned through practice of the invention.

In accordance with a particular embodiment, a photovoltaic (PV) module is provided with a plurality of individual serially connected solar cells defined thereon. A bus tape is applied along respective ones of the cells at generally opposite longitudinal ends of the substrate for collecting the charge generated by the plurality of solar cells. A conductive member, such as a foil ribbon, tape, strip, or the like, is interconnected between the bus tapes. At the point of electrical connection between the conductive member and the bus tapes, the conductive member is disposed beneath the bus tapes and is in direct conductive contact with the respective solar cell. The conductive member is connected to a junction box, which is configured for delivering the collected generated charge from the plurality of solar cells to an external load or other component.

In certain embodiments, the conductive member is a foil ribbon that is disposed on an insulating material strip. In certain embodiments, the insulating material strip may terminate at the boundary (e.g., a scribe line) of the solar cells on which the bus tapes are attached. A portion of the foil ribbon extends longitudinally beyond the ends of the insulating material strip and onto the respective solar cells. The bus tapes are then applied along the cells so as to overlie the foil ribbon at the point of electrical connection between the foil ribbon and bus tapes. The extending portions of the foil ribbon may be in the form of "flaps" that are unattached (e.g., not directly adhered) to the cells and are pressed against the cells by attachment of the bus tapes to the cells.

The bus tapes extend longitudinally along their respective solar cell and, in certain embodiments, may include an adhesive layer for attaching to the respective cells and to the foil ribbon.

In particular embodiments, the longitudinal sides of the bus tapes are disposed against or spaded from the ends of the insulating material strip. In other embodiments, a portion of the bus tapes may overlie the ends of the insulating material strip.

To provide an enhanced electrical connection, it may be desired to use a conductive adhesive material between the bus tapes and the underlying conductive member. In a particular embodiment, this material may be a solder, for example a low temperature solder having a melting point of between about 100 degrees Celsius to about 150 degrees Celsius. In a particular embodiment, the solder is Sn—Bi alloy having a melting point of about 138 degrees Celsius.

Variations and modifications to the embodiment of the photovoltaic module discussed above are within the scope and spirit of the invention and may be further described herein.

The present invention also encompasses an improved bus tape connection as set forth herein for photovoltaic (PV) module substrates having a plurality of individual serially connected solar cells defined thereon. The connection includes a bus tape applied along respective ones of the solar cells for collecting the charge generated by the plurality of solar cells between said bus tapes. A conductive member is interconnected between the bus tapes and is disposed beneath the bus tapes in direct conductive contact with the respective solar cells. A junction box is configured for delivering the generated charge to an external load or other component, with the conductive member connected to the junction box.

In a particular embodiment of the connection, the conductive member is a foil ribbon. An insulating material strip is disposed beneath the foil ribbon and a portion of the foil ribbon extends longitudinally beyond ends of the insulating material strip and onto the respective solar cells beneath the bus tapes. The bus tapes may include an adhesive for attaching to the respective solar cells and to the foil ribbon.

In one embodiment, portions of the foil ribbon extending beyond the insulating material strip are unattached to the solar cells and are pressed against the solar cells by attachment of the bus tapes to the solar cells.

The insulating material strip may not extend onto the respective solar cells, and the bus tapes may overhang the ends of said insulating material strip. In an alternate embodiment, the bus tapes are disposed against or spaced from the ends of the insulating material strip.

The connection may include a conductive adhesive material disposed between the bus tapes and the conductive member. This conductive adhesive may be, for example, a solder.

Variations and modifications to the connection embodiments discussed above are within the scope and spirit of the invention and may be further described herein.

These and other features, aspects and advantages of the present invention will become better understood with reference to the following description and appended claims.

BRIEF DESCRIPTION OF THE DRAWINGS

A full and enabling disclosure of the present invention, including the best mode thereof, is set forth in the specification, which makes reference to the appended drawings, in which:

FIG. 1 is a view of a back side of a photovoltaic module (PV);

FIG. 2 is a view of the front side of the PV module of FIG. 1;

FIG. 3 is a back view of a PV module particularly illustrating the foil ribbon and bus tapes;

FIG. 4 is an enlarged diagrammatic view of the connection location of the foil ribbon and bus tapes in accordance with aspects of the invention; and, FIG. 5 is side cut-away view of the connection between the foil ribbon and bus tape.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

FIGS. 1 and 2 illustrate a photovoltaic (PV) module 10. FIG. 1 is a view of the back side of the module and FIG. 2 is a view of the front side of the module 10 that is exposed to sunlight for generation of electricity. The module 10 includes a substrate 12 (typically a glass substrate) with opposite longitudinal ends 18 and sides 20. Referring to FIG. 1, a junction box 24 is provided with leads 26 that allow the module 10 to be connected to a load, other modules, an electrical grid, and so forth. As is well known in the art, the module 10 includes a plurality of individual solar cells 16 (FIG. 3) that are defined by scribe lines 14 formed in the various thin film semiconductor layers deposited onto the substrate 12. The individual solar cells 16 are connected in series, and the charge generated by the cells is collected via bus tapes 28, a conductive member 22, and the junction box 24 with associated leads 26, as discussed in greater detail below.

FIG. 1 illustrates the back side of the PV module 10 in a completed state wherein a laminate sheet 34 has been applied over the cells 16, conductive member 22, and bus tapes 28. FIG. 3 illustrates the back side of the module 10 prior to application of the laminate 34 and junction box 24. Referring to FIG. 3, an electrically conductive bus tape 28 is aligned with a respective solar cell at each of the opposite longitudinal ends 18 of the substrate 12. The respective bus tapes 28 are centered over a first cell at one end of the module 10 and over another cell at the opposite end of the PV module. These cells may (but need not) be the extreme first and last cell of the PV module 10. Thus, the bus tape 28 over the first cell constitutes the positive (+) side of the module 10 and the opposite bus tape 28 constitutes the negative (−) side of the module 10.

The bus tape 28 is an electrically conductive material that serves to collect the charge across the length of the cell over which it is centered. In this regard, the bus tapes 28 must be securely adhered to their respective cells 16 and make sufficient electrical contact with the cell. A number of conventional and commercially available bus tapes are available for this purpose. For example, 3M Corporation supplies an embossed bus tape having a pre-applied adhesive thereon. The adhesive is non-conductive and serves to attach the bus tape 28 to the substrate. The embossed pattern creates ridges that essentially extend through the adhesive and make point and line contact with the solar cell 16.

A conductive member 22 interconnects the bus tapes 28. In a particular embodiment, this conductive member 22 is a foil tape, strip, or ribbon that is connected to the respective bus tapes 28 and extends the longitudinal length of the PV module 10. As is a common practice in the art, the conductive member 22 is centered on an insulation material strip 32 (FIG. 4) deposited over the cells 16 so that the conductive member 22 does not short any of the cells 16. The insulation material strip 32 is typically an adhesive insulation tape having ends 33.

As is understood in the art, the conductive member 22 is eventually separated at a location where the junction box 24 is installed, with each of the leads 26 attached to one of the separated ends of the conductive member 22. This construction is well known to those in the art and need not be described in detail for an appreciation of the present invention.

Referring to FIGS. 4 and 5 in particular, at the point of electrical contact between the conductive member 22 and bus tapes 28 at the opposite longitudinal ends 18 of the PV modules 10, the conductive member 22 extends past the ends 33 of the insulation material strip 32 and is in direct electrical contact against the solar cell 16. The bus tapes 28 are along the length of their respective cells 16 and overlie the conductive member 22.

For example, referring still to FIGS. 4 and 5, the insulation material strip 32 may be the first component that is applied along the longitudinal length of the PV module 10 from the first solar cell 16 to the last solar cell at the opposite end of the module 10. This strip 32 has a length so as not to extend completely across the solar cells 16 on which the bus tapes 28 are to be attached. For example, as seen in FIG. 4, the ends 33 of the strip 32 may extend to the scribe line 14 that defines the boundary of the cell 16, or may extend slightly onto the cell 16. The conductive member 22 (e.g., in the form of a conductive foil ribbon) is then aligned on and attached to the strip 32. The conductive member 22 extends past the ends 33 of the strip 32 so as to eventually be pressed directly against the surface of the cell 16. The extending portion of the conductive member 22 need not be adhered to the cell 16 and, in this regard, may define a flap 23 that simply extends over the insulating material strip 32.

The bus tape 28 is then applied across the respective cell 16 and overlies the flap portion 23 of the conductive member 22. By way of attachment of the bus tape 28 (e.g., adhesive attachment) to the cell 16, the underlying conductive member 22 is also pressed into direct electrical contact with the cell 16.

As depicted in FIG. 4, the bus tapes 28 may be spaced from the ends 33 of the insulating material strip 32, or may be disposed against the ends 33. In an alternate embodiment as depicted in FIG. 5, a portion 29 of the bus tape 28 may overlie the end 33 of the insulating material strip 32.

In the embodiments depicted in FIGS. 4 and 5, it should be appreciated that a dual contact is created between the conductive member 22 and the cells 16. The bus tapes 28 collect the charge along the polar opposite cells 16 and deliver the charge to the underlying conductive member 22 at the point of electrical contact between the elements. At the same time, the conductive member 22 is in direct electrical contact with the thin film metallization of the cell 16. This secondary contact provides a reliable "back-up" contact in the event that the bus tape 28 is pulled off of the conductive member 22 during temperature life cycling tests or other normal use of the PV module 10. Temperature cycling tests of PV modules 10 in accordance with the embodiments described herein have shown a significant decrease in failure rate as compared to conventional designs wherein the conductive member is stacked on the insulating material strip and the bus tape is stacked on the insulating member.

In order to further improve the reliability of the contact between the bus tapes 28 and the conductive member 22, it may be desired to use a layer of a conductive adhesive material 30 applied between the components, as depicted in FIG. 5. This material 30 may be, for example, a low resistance homogeneously conductive epoxy, glue, solder, or any other suitable type of conductive compound or material that serves to adhere the conductive member 22 to the bus tapes 28 with the desired electrical contact characteristics. In a particular embodiment, the material 30 is solder, preferably a low temperature solder having a melting point of between about 100° C. to about 150° C. In a particular embodiment, the solder is a Sn—Bi alloy having a melting point of about 138° C. Numerous conductive low temperature solders are available and may be used for this purpose.

In the embodiment wherein the material 30 is a solder, in a subsequent processing step, the solder material 30 is heated and reflows, which results in the bus tape 28 being bonded to the underlying conductive member 22. The conductive solder ensures a strong and robust electrical attachment between the conductive member 22 and the bus tape 28 while providing a relatively low resistance electrical contact between the components.

The solder may be applied between the foil ribbon 22 and bus tapes 28 in any suitable amount and pattern. For example, the solder may be applied in a uniform coating having a thickness that is generally about the same thickness as the bus tape 28.

The solder may be heated and reflow in a subsequent processing step wherein a localized heat source is applied to the cross-over location between the bus tapes 28 and conductive member 22. For example, a heat rod, roller, or the like, may be applied at the cross-over location. In an alternative embodiment, the subsequent lamination step wherein the lamination sheet 34 is applied to the back side of the module 10 may provide sufficient heat for causing the solder 30 to reflow. In this embodiment, a separate heating step would not be necessary.

It should be readily appreciated that the present invention also encompasses any methodology embodiment for forming the improved connection between the bus tapes 28 and conductive member 22, as discussed above. For example, the present invention includes a method embodiment wherein a strip of insulation tape is disposed along the length of the substrate, with the insulation tape having length so as not to extend fully across the opposite end cells of the substrate. A conductive member is applied so as to overlie the insulation tape and to extend onto the opposite end cells of the substrate. A respective bus tape is applied along the end cells of the substrate, with each of the bus tapes crossing over the conductive member and pressing the conductive member into direct conductive contact with the respective end cell. The bus tapes may be adhered to the respective cells and to the underlying conductive member.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A photovoltaic (PV) module, comprising:
   a substrate having a plurality of individual serially connected solar cells defined thereon;
   a bus tape applied along each of at least two of said plurality of solar cells for collecting the charge generated by said plurality of solar cells between said bus tapes;
   a conductive member interconnected between said bus tapes, said conductive member disposed on an underside of each of said bus tapes and in direct contact with said at least two solar cells, wherein said conductive member is a foil ribbon;
   an insulating material strip beneath said foil ribbon, a portion of said foil ribbon extending longitudinally beyond ends of said insulating material strip and onto said at least two solar cells of the plurality of solar cells beneath said bus tapes; and
   a junction box configured for delivering the generated charge to an external load or other component, said conductive member connected to said junction box.

2. The photovoltaic (PV) module as in claim 1, wherein said bus tapes include an adhesive for attaching to said at least two solar cells of the plurality of solar cells and to said foil ribbon.

3. The photovoltaic (PV) module as in claim 2, wherein said portions of said foil ribbon extending beyond said insulating material strip are unadhered to said solar cells and are pressed against said cells by attachment of said bus tapes to said solar cells.

4. The photovoltaic (PV) module as in claim 1, wherein said insulating material strip does not extend onto said at least two solar cells of the plurality of solar cells.

5. The photovoltaic (PV) module as in claim 1, wherein said bus tapes overhang said ends of said insulating material strip.

6. The photovoltaic (PV) module as in claim 1, wherein said bus tapes are disposed against or spaced from said ends of said insulating material strip.

7. The photovoltaic (PV) module as in claim 1, further comprising a conductive adhesive material disposed between said bus tapes and said conductive member.

8. The photovoltaic (PV) module as in claim 7, wherein said conductive adhesive material comprises a solder.

9. A connection for a photovoltaic (PV) module having a substrate with a plurality of individual serially connected solar cells defined thereon, said connection comprising;
 a bus tape applied along each of at least two of said plurality of solar cells for collecting the charge generated by the plurality of solar cells between said bus tapes;
 a conductive member interconnected between said bus tapes, said conductive member disposed on an underside of each of said bus tapes and in direct contact with said at least two solar cells, wherein said conductive member is a foil ribbon;
 an insulating material strip beneath said foil ribbon, a portion of said foil ribbon extending longitudinally beyond ends of said insulating material strip and onto said at least two solar cells of the plurality of solar cells beneath said bus tapes; and
 a junction box configured for delivering the generated charge to an external load or other component, said conductive member connected to said junction box.

10. The connection as in claim 9, wherein said bus tapes include an adhesive for attaching to said at least two solar cells of the plurality of solar cells and to said foil ribbon.

11. The connection as in claim 10, wherein said portions of said foil ribbon extending beyond said insulating material strip are unattached to said at least two solar cells of the plurality of solar cells and are pressed against said at least two solar cells by attachment of said bus tapes to said at least two solar cells.

12. The connection as in claim 9, wherein said insulating material strip does not extend onto said at least two solar cells of the plurality of solar cells.

13. The connection as in claim 9, wherein said bus tapes overhang said ends of said insulating material strip.

14. The connection as in claim 9, wherein said bus tapes are disposed against or spaced from said ends of said insulating material strip.

15. The connection as in claim 9, further comprising a conductive adhesive material disposed between said bus tapes and said conductive member.

16. The connection as in claim 15, wherein said conductive adhesive material comprises a solder.

17. The photovoltaic (PV) module as in claim 1, wherein said insulating material strip extends between scribe lines that define said at least two solar cells of the plurality of solar cells, wherein said bus tapes extend over said insulating material strip.

18. The connection as in claim 9, wherein said insulating material strip extends between scribe lines that define said at least two solar cells of the plurality of solar cells, wherein said bus tapes extend over said insulating material strip.

* * * * *